(12) United States Patent
Jacobs et al.

(10) Patent No.: US 7,410,820 B2
(45) Date of Patent: Aug. 12, 2008

(54) MEMS PASSIVATION WITH PHOSPHONATE SURFACTANTS

(75) Inventors: Simon Joshua Jacobs, Lucas, TX (US); Seth Adrian Miller, Sachse, TX (US)

(73) Assignee: Texas Instruments Incorporated, Dallas, TX (US)

( * ) Notice: Subject to any disclaimer, the term of this patent is extended or adjusted under 35 U.S.C. 154(b) by 310 days.

(21) Appl. No.: 11/031,655

(22) Filed: Jan. 5, 2005

(65) Prior Publication Data

US 2005/0147750 A1 Jul. 7, 2005

Related U.S. Application Data

(60) Provisional application No. 60/534,337, filed on Jan. 5, 2004.

(51) Int. Cl.
*H01L 21/00* (2006.01)
(52) U.S. Cl. .............................. 438/51; 438/55; 438/64
(58) Field of Classification Search .................. 438/51, 438/55, 64, 106, 781
See application file for complete search history.

(56) References Cited

U.S. PATENT DOCUMENTS

| | | | |
|---|---|---|---|
| 5,602,671 A | 2/1997 | Hornbeck | |
| 5,853,797 A * | 12/1998 | Fuchs et al. | 427/58 |
| 6,365,229 B1 | 4/2002 | Robbins | |
| 6,930,367 B2 * | 8/2005 | Lutz et al. | 257/417 |
| 2002/0107159 A1 * | 8/2002 | DeSimone et al. | 510/175 |
| 2004/0203256 A1 * | 10/2004 | Yang et al. | 438/780 |
| 2004/0224095 A1 * | 11/2004 | Miller | 427/402 |

OTHER PUBLICATIONS

Zhu, et. al., "Self-Assembled Monolayer used in Micro-motors", pp. 1-19, 2000.
Gawalt, et. al, "Self-Assembly and Bonding of Alkanephosphonic Acids on the Native Oxide Surface of Titanium," *Langmuir* 2001, 17, 5736-38.
Hanson, et. al, "Bonding Self-Assembled, Compact Organophosphonate Monolayers to the Native oxide Surface of Silicon," *J. Am. Chem. Soc.* 2003, 125, 16074-80.

* cited by examiner

*Primary Examiner*—Tuan H Nguyen
(74) *Attorney, Agent, or Firm*—Wade James Brady, III; Frederick J. Telecky, Jr.

(57) ABSTRACT

Phosphonate surfactants are employed to passivate the surfaces of MEMS devices, such as digital micromirror devices. The surfactants are adsorbed from vapor or solution to form self-assembled monolayers at the device surface. The higher binding energy of the phosphonate end groups (as compared to carboxylate surfactants) improves the thermal stability of the resulting layer.

20 Claims, No Drawings

MEMS PASSIVATION WITH PHOSPHONATE SURFACTANTS

RELATED APPLICATIONS

This application claims priority to commonly-owned U.S. provisional patent application Ser. No. 60/534,337, filed Jan. 5, 2004.

FIELD OF THE INVENTION

This invention relates to MEMS devices and the control of stiction, friction, and related processes through the application to such a devices of a passivation layer formed from a phosphonate surfactant.

BACKGROUND

MicroElectro Mechanical Systems (MEMS) are semiconductor chips that support a top layer of small mechanical devices, such as fluid sensors or mirrors. These devices are built onto chips through growth and etching processes similar to those used to define the topography of an integrated circuit. These processes are capable of creating devices with micron dimensions. The MEMS itself typically packs multiple elements on a single chip.

A MEMS device, specifically a Digital Micromirror Device (DMD), is the basis for Digital Light Processing™ technology. The DMD microchip functions as a fast, reflective digital light switch. The switching is accomplished through the rotation of multiple small mirrors in response to an electric potential. In a mirror's "on" state of rotation, light from a projection source is directed to the pupil of a projection lens and a bright pixel appears on the projection screen. In the "off" state, light is directed out of the pupil and the pixel appears dark. Thus the DMD provides a digital basis for constructing a projected image. Digital Light Processing™ has been employed commercially in televisions, cinemagraphic projection systems, and business-related projectors.

In a typical DMD design, metal, e.g., aluminum, is deposited to form support posts, a hinge, the mirror itself, and structures (such as yokes or landing tips) to contain its rotation. The processes used to define these structures on a DMD (or any other MEMS device) are known in the art and are not the subject of this invention. These processes may include growth of a passivation layer on the mechanical device.

Passivation layers are added to address several problems with device operation. One such problem is static friction (stiction), the static adhesion force between resting bodies in contact (such as two surfaces of a DMD pixel). Another problem is dynamic friction, which arises from the contact of moving elements in the device. Effective passivation layers reduce stiction and friction by reducing the surface energy of the device. For rotating devices (such as the hinge in a DMD), repeated movement and deformation displace molecules and permanently bias the zero state of the rotation. Passivation layers may reduce this hinge memory accumulation by stabilizing certain states of the surface.

Passivation layers are typically formed from surfactants. Effective surfactants are believed to function by forming self-assembled monolayers at the device surface. These monolayers are ordered molecular assemblies formed by the adsorption of a surfactant on a solid surface. Zhu, et. al., "Self-Assembled Monolayer used in Micro-motors," report the use of such monolayers, formed from an octadecyltrichlorosilane precursor, as a passivation layer for a silicon micromotor. Hornbeck, "Low Surface Energy Passivation Layer for Micromechanical Devices" (U.S. Pat. No. 5,602,671) has described the use of self-assembled monolayers as passivation for MEMS devices including DMDs. Suitable self-assembling carboxylates may be introduced as a vapor under conditions designed to facilitate the growth of self-assembled monolayers, as disclosed by Robbins, "Surface Treatment Material Deposition and Recapture," (U.S. Pat. No. 6,365, 229).

Self-assembled monolayers have been studied outside the device context. Much of the early research in this field concerned the interaction of surfactants with gold surfaces; but work has been published relating to other metals (and metalloids), including silicon and aluminum. Work pertaining to phosphonate/phosphonic acid surfactants includes: Gawalt, et. al, "Self-Assembly and Bonding of Alkanephosphonic Acids on the Native Oxide Surface of Titanium," *Langmuir* 2001, 17, 5736-38; Hanson, et. al, "Bonding Self-Assembled, Compact Organophosphonate Monolayers to the Native oxide Surface of Silicon," *J. Am. Chem. Soc.* 2003, 125, 16074-80; and Nitowski, G., "Topographic and Surface Chemical Aspects of the Adhesion of Structural Epoxy Resins to Phosphorus Oxo Acid Treated Aluminum Adherents."

Within the device context, the passivation layer should be stable under the intended operating conditions of the MEMS. While carboxylate surfactants have functioned adequately in commercial DMD products, the resulting monolayers may thermally desorb under foreseeable conditions of operation. Such desorption, and the resulting increase in stiction, friction, and hinge memory accumulation, would adversely impact the operation of the device. It is therefore desirable to form passivation layers from surfactants that bind more tightly with the surface of interest. That is one objective of the present invention. In addition, because of their reduced acidity (as compared to some commonly employed carboxylates), phosphonic acid surfactants may provide compatibility advantages with common packaging materials, such as Kovar.

SUMMARY OF THE INVENTION

The invention provides a MEMS device having an improved passivation layer formed from a phosphonate surfactant. In certain embodiments of the invention, the passivation layer is applied to an aluminum surface. In other embodiments, the MEMS device is a Digital Micromirror Device, and the mechanical elements coated with the passivation layer may include the hinges that rotate the mirrors. The phosphonate surfactant may be introduced either as an alkylphosphonic acid or as esters of the same.

The invention also provides methods for assembling a layer of phosphonate surfactant on the surface of a MEMS device. Where the phosphonate is introduced as an ester of an alkylphosphonic acid, that method may include a step of hydroxylating the surface. In specific embodiments, the methods for assembling layers of these materials include vapor phase deposition and deposition from solution.

DETAILED DESCRIPTION OF THE INVENTION

The mechanical structures of a MEMS device are grown on a semiconductor surface through any of a variety of methods that are known in the art. These methods may include conventional semiconductor processing techniques like sputter metal deposition, lithography, and plasma etching.

Fabrication of a Digital Micromirror Device

In one example, a DMD superstructure is grown on an SRAM address circuit employing standard CMOS technology. A thick oxide is deposited over Metal-2 of the CMOS and planarized through chemical mechanical polishing to yield a flat substrate for DMD fabrication. Construction of the DMD superstructure begins with deposition and patterning of aluminum for a metal layer. An organic sacrificial layer (spacer) is then spin-coated, lithographically patterned and hardened. Holes patterned in the spacer will form metal support posts after the yoke metal covers their sidewalls. These posts will support the hinges and the mirror address electrodes.

A second metal layer is sputter-deposited and patterned to form the hinges and other elements, such as springs, supports, electrodes, or mechanical stops that may be desirable for control of micromirror motion.

A second organic sacrificial layer is spin-coated, patterned, then hardened. The holes patterned in this spacer form the support posts that secure the mirrors to the underlying yokes. An aluminum layer is sputter-deposited and patterned over this spacer to form the mirrors. A final coating of photoresist completes the wafer.

Through standard semiconductor processes, the wafers are singulated, and the individual die are mounted in ceramic headers. A plasma etching step is then used to remove the photoresist from the MEMS structures, thereby freeing the superstructure.

Device Passivation

After the device superstructure has been fabricated, a passivation layer is applied to it. The passivation layer comprises a phosphonate surfactant, which may be introduced either as an alkylphosphonic acid ($RPO(OH)_2$) or esters of the same. For preferred surfactants, the alkyl group is a hydrocarbon straight chain having between four and eighteen carbon atoms. It may be saturated or unsaturated. It may be partially or fully fluorinated. It may include linear hetero atoms, such as oxygen. Methods for synthesizing alkyl phosphonic acids and esters are disclosed in, e.g., U.S. Pat. Nos. 4,108,889; 4,393,011; and 4,655,883. Suitable phosphonates include materials sold commercially as lubricants. For reasons of availability, n-octylphosphonic acid (NOPA) and octadecylphosphonic acid (NOPA) are especially preferred surfactants.

The phosphonate surfactant may be introduced as a salt or ester of the alkylphosphonic acid. For reasons of reactivity and availability, preferred esters include the methyl ester ($RPO(CH_3)_2$), ethyl ester ($RPO(CH_2CH_3)_2$) and trimethylsilyl ester ($RPO(Si(CH_3)_3)_2$). Before the ester is used, it may be desirable to first hydroxylate the surface to be coated. This can be done by exposing the surface to a solution of sulfuric acid and hydrogen peroxide, or by exposing the device to a plasma formed from one or more of the following: hydrogen, water, ammonia and oxygen. As used herein, the term "phosphonate surfactant" encompasses surfactants introduced both as an alkylphosphonic acid and as salts or esters of the same.

The phosphonate surfactant is contacted with the surface to be coated under conditions selected to facilitate the formation and adsorption of a self-assembled monolayer. The surface may be exposed to a vapor of the phosphonate surfactant—typically at or near the native surfactant vapor pressure, under vacuum, at temperatures below 150° C. Alternatively, the surfactant may be adsorbed from solution. Suitable solution-based methods include the THF/aerosol method disclosed in Gawalt, et. al, and the THF/evaporation method disclosed in Hanson, et. al. Water, isopropyl alcohol, and supercritical $CO_2$ are other solvents that may be particularly useful in the adsorption of phosphonate surfactant monolayers on the surfaces of interest.

The surface to be coated should be exposed to the phosphonate surfactant for a time sufficient for the self-assembled monolayer to form. For vapor-based adsorption, that time is typically in the range of minutes. For solution-based adsorption, that time is typically in the range of several hours. For any process, monolayer formation is conveniently verified by measuring liquid contact angles on a test surface. For aluminum, the process is substantially complete when the contact angle for water exceeds 100° or when the contact angle for methylene iodide exceeds 70°.

EXAMPLE 1

Aluminum-coated silicon substrates were cut into ~1.4× 1.4 cm coupons. Sample coupons were pre-washed with either isopropyl alcohol (IPA) or sodium carbonate solution. The sodium carbonate-washed substrates were prepared by dipping the substrates into a 0.1 molal solution (pH=11.47) for 15 seconds under ambient conditions. The substrates were then rinsed with deionized, distilled water and air-dried under ambient conditions. The coupons were exposed to n-octylphosphonic acid (NOPA) or octadecylphosphonic acid (NOPA) in liquid solution. The coupons were also exposed, for purposes of comparison, to lauric acid (LA) in liquid solution. Surfactant solutions were prepared at a 0.0128 molal concentration, and the samples were soaked under ambient conditions for one hour. The samples were post-washed (with either water or IPA) and air-dried for a period of at least four hours. Static water contact angles were measured using a Gardco Model PG-1 Goniometer. After heating for 12 hours at 150° C., the static water contact angles were measured again.

| Sample | Prep History | Initial Contact Angle | Contact Angle After 12 h at 150° C. |
|---|---|---|---|
| 1 | Water pre-wash | 69 +/− 5 | 59 +/− 3 |
| 2 | Sodium carbonate pre-wash | 56 +/− 4 | 58 +/− 4 |
| 3 | NOPA, water carrier, sodium carbonate pre-wash, water post-wash | 108 +/− 4 | 72 +/− 3 |
| 4 | NOPA, IPA carrier, water pre-wash, water post-wash | 102 +/− 5 | 74 +/− 7 |
| 5 | OPA, IPA carrier, IPA pre-wash, water post-wash | 114 +/− 6 | 110 +/− 2 |
| 6 | LA, IPA carrier, IPA pre-wash, IPA post-wash | 110 +/− 4 | 66 +/− 2 |
| 7 | LA, water carrier, IPA pre-wash, IPA post-wash | 113 +/− 3 | 68 +/− 5 |

This example demonstrates the improved thermal stability (as compared to carboxylates) of monolayers formed from phosphonate surfactants.

EXAMPLE 2

Aluminum-coated silicon substrates were cut into ~1.4× 1.4 cm coupons. Sample coupons were either treated "as received" or washed with sodium carbonate. Sodium carbonate-washed substrates were prepared by dipping the substrates into a 0.1 molal solution (pH=11.47) for 15 seconds under ambient conditions. The substrates were then rinsed with deionized, distilled water and air-dried under ambient conditions. The coupons were exposed to n-octylphosphonic acid (NOPA) or octadecylphosphonic acid (NOPA) in liquid solution. The coupons were also exposed to lauric acid (LA), stearic acid (ST) and various surfactant mixtures in liquid solution. Surfactant solutions were prepared at a 0.0128 molal concentration, and the samples were soaked under ambient conditions for one hour. The samples were post-washed with water and air-dried for a period of at least four hours. Static water contact angles were measured (using a Gardco Model PG-1 Goniometer) before and after a 12-hour, 150° C. thermal exposure test, and before and after a 24-hour ambient soak test.

| Sample | Surfactant | Solvent | Cleaning Method | Initial Contact Angle | Contact Angle: 12 hours at 150° C. | Contact Angle: 24 hour water soak |
|---|---|---|---|---|---|---|
| 1 | NOPA | water | as received | 111 +/− 2 | 65 +/− 2 | 55 +/− 4 |
| 2 | NOPA | water | carbonate | 115 +/− 4 | 88 +/− 9 | 62 +/− 27 |
| 3 | LA | IPA | as received | 113 +/− 2 | 55 +/− 2 | 59 +/− 3 |
| 4 | LA | IPA | carbonate | 112 +/− 3 | 66 +/− 4 | 38 +/− 15 |
| 5 | OPA | IPA | as received | 115 +/− 2 | 111 +/− 4 | 109 +/− 3 |
| 6 | OPA | IPA | carbonate | 115 +/− 3 | 104 +/− 5 | 107 +/− 6 |
| 7 | ST | IPA | as received | 116 +/− 3 | 77 +/− 3 | 106 +/− 4 |
| 8 | ST | IPA | carbonate | 115 +/− 3 | 80 +/− 3 | 70 +/− 20 |
| 9 | OPA/ST (80/20) | IPA | as received | 112 +/− 2 | 107 +/− 5 | 100 +/− 4 |
| 10 | OPA/ST (80/20) | IPA | carbonate | 119 +/− 5 | 102 +/− 6 | 105 +/− 4 |
| 11 | OPA/ST (50/50) | IPA | as received | 115 +/− 2 | 112 +/− 4 | 105 +/− 2 |
| 12 | OPA/ST (50/50) | IPA | carbonate | 115 +/− 2 | 102 +/− 6 | 97 +/− 4 |
| 13 | OPA/ST (20/80) | IPA | as received | 118 +/− 2 | 91 +/− 2 | 108 +/− 5 |
| 14 | OPA/ST (20/80) | IPA | carbonate | 113 +/− 3 | 77 +/− 6 | 90 +/− 3 |

This example demonstrates the improved thermal stability (as compared to carboxylates) of monolayers formed from phosphonate surfactants.

What is claimed is:

1. A method for fabricating a MEMS device comprising contacting a surface of said device with a vapor comprising octadecylphosphonic acid or a salt or ester thereof.
2. The method of claim 1, wherein said surface comprises aluminum.
3. The method of claim 1, wherein said MEMS device is a digital micromirror device.
4. The method of claim 1, further comprising, prior to contacting the surface of the device with the vapor, washing the surface with a carbonate or alcohol.
5. The method of claim 4, wherein the carbonate comprises sodium carbonate.
6. The method of claim 1, wherein the vapor comprises an ester of octadecylphosphonic acid and, further comprising, prior to contacting the surface of the device with the vapor, hydroxylating the surface.
7. The method of claim 6, wherein hydroxylating the surface comprises exposing the surface to sulfuric acid, hydrogen peroxide, or a plasma formed from hydrogen, water, ammonia or oxygen.
8. The method of claim 1, wherein the solution comprises an ester of octadecylphosphonic acid and, further comprising, prior to contacting the surface of the device with the solution, hydroxylating the surface.
9. The method of claim 8, wherein hydroxylating the surface comprises exposing the surface to sulfuric acid, hydrogen peroxide, or a plasma formed from hydrogen, water, ammonia or oxygen.
10. A method for fabricating a MEMS device comprising contacting a surface of said device with a solution comprising a solvent and octadecylphosphonic acid or a salt or ester thereof.
11. The method of claim 10, wherein said surface comprises aluminum.
12. The method of claim 10, wherein said MEMS device is a digital micromirror device.
13. The method of claim 10, further comprising, prior to contacting the surface of the device with the solution, washing the surface with a carbonate or alcohol.
14. The method of claim 13, wherein the carbonate comprises sodium carbonate.
15. The method of claim 10, wherein the solvent comprises an alcohol or water.
16. The method of claim 10, wherein the alcohol comprises isopropyl alcohol.
17. A method for fabricating a MEMS device comprising:
   washing a surface of the device with a carbonate or alcohol; and
   contacting the surface of the device with a solution comprising a solvent and an alkylphosphonic acid or a salt or ester thereof, wherein the alkylphosphonic acid comprises a hydrocarbon straight chain of at least 8-17 carbon atoms.

18. The method of claim 17, wherein the alkylphosphonic acid comprises n-octylphosphonic acid.

19. The method of claim 17, wherein the carbonate comprises sodium carbonate.

20. The method of claim 17, wherein said MEMS device is a digital micromirror device.

* * * * *